United States Patent
Brown

(10) Patent No.: US 9,327,322 B2
(45) Date of Patent: May 3, 2016

(54) SONIC ENERGY TO GENERATE ACTIVE SPECIES FOR SURFACE PREPARATION, CLEANING, AND ETCHING

(71) Applicant: TOKYO ELECTRON LIMITED, Tokyo (JP)

(72) Inventor: Ian J Brown, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 780 days.

(21) Appl. No.: 13/633,027

(22) Filed: Oct. 1, 2012

(65) Prior Publication Data

US 2013/0319459 A1    Dec. 5, 2013

Related U.S. Application Data

(60) Provisional application No. 61/654,912, filed on Jun. 3, 2012.

(51) Int. Cl.
| | |
|---|---|
| B08B 7/00 | (2006.01) |
| B08B 3/12 | (2006.01) |
| B01F 3/08 | (2006.01) |
| H01L 21/67 | (2006.01) |
| H01L 21/02 | (2006.01) |
| G10K 15/04 | (2006.01) |
| C02F 1/36 | (2006.01) |

(52) U.S. Cl.
CPC ............... B08B 3/12 (2013.01); B01F 3/0819 (2013.01); G10K 15/043 (2013.01); H01L 21/02052 (2013.01); H01L 21/67057 (2013.01); C02F 1/36 (2013.01)

(58) Field of Classification Search
CPC .......... B08B 3/12; B01F 3/0819; C02F 1/36; G10K 15/043; H01L 21/02052; H01L 21/67057

USPC ................................................ 134/1.1, 1, 1.3
See application file for complete search history.

(56) References Cited

U.S. PATENT DOCUMENTS

| | | | |
|---|---|---|---|
| 6,800,142 B1 | 10/2004 | Tipton et al. | |
| 7,159,599 B2 | 1/2007 | Verhaverbeke et al. | |
| 7,432,177 B2 | 10/2008 | Papanu et al. | |
| 7,585,686 B2 | 9/2009 | Verhaverbeke et al. | |
| 7,914,623 B2 | 3/2011 | Papanu et al. | |
| 2003/0015216 A1* | 1/2003 | Nicolosi | B08B 3/12 134/1.3 |
| 2003/0175947 A1 | 9/2003 | Liu et al. | |
| 2003/0200986 A1* | 10/2003 | Yeo | B08B 3/02 134/1.3 |
| 2004/0012104 A1* | 1/2004 | Ozawa | B01D 53/22 261/122.1 |
| 2006/0286783 A1 | 12/2006 | Papanu et al. | |
| 2008/0081485 A1 | 4/2008 | Papanu et al. | |
| 2008/0156355 A1* | 7/2008 | Puri | H01L 21/02052 134/99.1 |
| 2008/0286697 A1* | 11/2008 | Verhaverbeke | H01L 21/67069 430/322 |

* cited by examiner

Primary Examiner — Michael Kornakov
Assistant Examiner — Katelyn Whatley
(74) Attorney, Agent, or Firm — Wood, Herron & Evans, LLP

(57) ABSTRACT

Provided is a method for generating active species in a treatment liquid used in a surface treatment system, the surface treatment system comprising a processing chamber and a treatment liquid delivery system, the treatment liquid delivery system having a mixing zone and an active species generation zone. A substrate and a treatment liquid comprising one or more chemical solutions and/or one or more process gases are provided. Sonic energy is applied to the treatment liquid in a mixing zone and/or an active species generation zone using one or more sonic devices. One or more selected surface treatment operating variables are controlled to optimize generation of active species in the treatment liquid. The one or more selected surface treatment operating variables are adjusted in order to meet one or more surface treatment objectives.

26 Claims, 12 Drawing Sheets

SONIC ENERGY TO GENERATE ACTIVE SPECIES FOR SURFACE PREPARATION, CLEANING, AND ETCHING

CROSS-REFERENCE TO RELATED APPLICATIONS

Pursuant to 37 C.F.R. §1.78(a)(4), this application claims the benefit of and priority to prior filed Provisional Application Ser. No. 61/654,912, filed Jun. 3, 2012, which is expressly incorporated herein by reference.

BACKGROUND

1. Field

The present application generally relates to the use of energy to generate active species in chemical solutions for use in substrate processing and specifically to the use of sonic energy to enhance the generation of active species for surface preparation, cleaning and etching of substrates.

2. Related Art

In semiconductor processing, control of generation and lifetime of active chemical species is important to optimize cleaning processes with respect to the removal efficiency of a desired material, removal time, and selectivity to other materials present on the substrate. In aqueous and plasma chemistry, generation of radicals is a convenient way to generate highly reactive and targeted species to remove material. Radicals are generated by mixing of two or more chemicals, (e.g. sulfuric acid and hydrogen peroxide to form hydroxyl radicals) or by application of energy, for example, heat, electrical/magnetic force, electrochemical energy or mechanical energy.

In particular, sonic irradiation is a specific method to locally produce significantly high temperatures when bubbles generated by the application of sonic energy collapse. Depending on bubble size prior to collapse, temperatures from 3,000K to 3,000,000 K can be reached once a bubble collapses. Such temperatures are not possible for the bulk chemical stream but would be very powerful to initiate generation of aqueous radical species. Sonic irradiation with a frequency range greater than 100 kHz is classified as ultrasonic and sonic irradiation with a frequency range 800-2000 kHz is classified as megasonic.

Wet processing is typically focused on stripping materials (e.g. photoresist) or selectively etching ($Si_3N_4$). With the shift from batch to single substrate processing, there is a need to improve the performance of existing chemistries such as sulfuric acid peroxide mixture (SPM), standard clean 1 (SC1), standard clean 2 (SC2), deionized water and ozone ($DI/O_3$), phosphoric acid ($H_3PO_4$), hydrofluoric acid (HF), buffered hydrogen fluoride (BHF), and the like, used in semiconductor processing for surface preparation, cleaning, or etching systems. Furthermore, there is a need to control the selected surface treatment operating variables in order to optimize the surface preparation process to meet the requirements of the application. In addition, there is a need to expand the process window of existing chemistries and extend the life of the treatment liquid for both single substrate and batch wet processing.

SUMMARY

Provided is a method for generating active species in a treatment liquid used in a surface treatment system, the surface treatment system comprising a processing chamber and a treatment liquid delivery system, the treatment liquid delivery system having a mixing zone and an active species generation zone. A substrate and a treatment liquid comprising one or more chemical solutions and/or one or more process gases are provided. Sonic energy is applied to the treatment liquid in a mixing zone and/or an active species generation zone using one or more sonic devices. One or more selected surface treatment operating variables are controlled to optimize generation of active species in the treatment liquid. The one or more selected surface treatment operating variables are adjusted in order to meet one or more surface treatment objectives.

DETAILED DESCRIPTION OF EXEMPLARY EMBODIMENT(S)

In order to facilitate the description of the present invention, a semiconductor substrate is utilized to illustrate applications of the concept. The methods and processes equally apply to other workpieces such as a wafer, disk, memory or the like. Similarly, aqueous sulfuric acid and hydrogen peroxide mixture may be utilized to illustrate a treatment liquid in the present invention. As mentioned below, other treatment liquids can alternatively be used. The treatment liquid can include primary, secondary, and tertiary chemicals, one or more process gases, and reaction products. In this application, a reference to sonic devices includes sonic devices such as acoustic transducers and similar equipment that can operate in the frequency range from 20 to 2,000 kHz.

Figure 1:
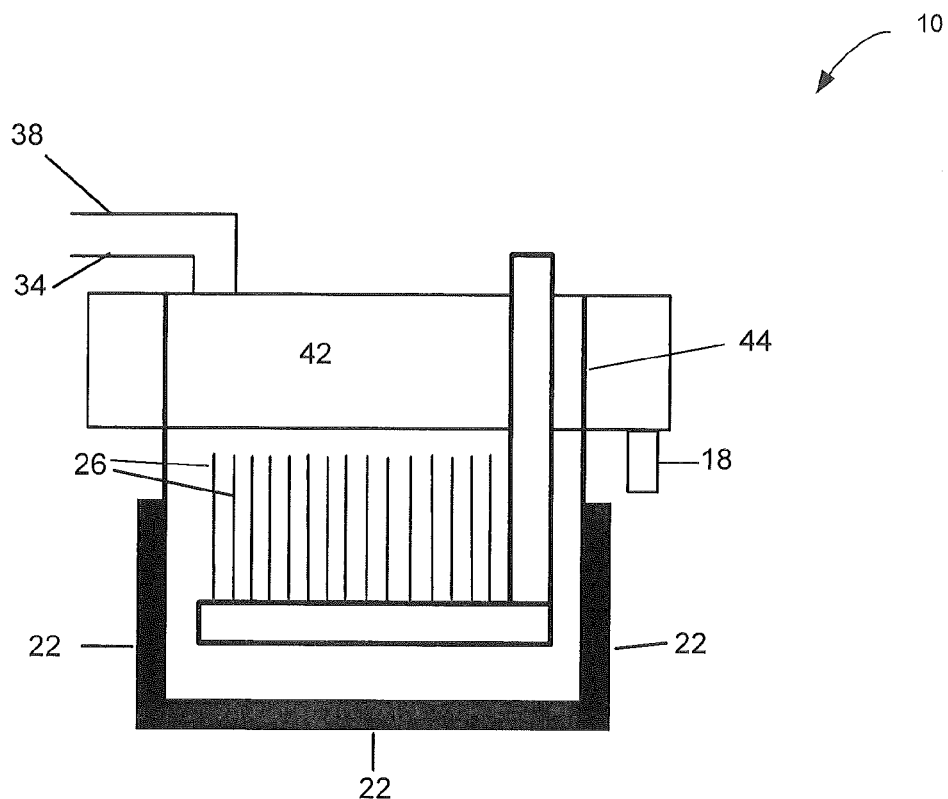
FIG. 1 is an architectural diagram illustrating a prior art method of resist stripping in a batch etch process.

Referring to FIG. 1, an architectural diagram 10 illustrating a prior art method of surface treatment system such as resist stripping in a batch etch process, where the etch chemicals (etchants) are dispensed using one or more input streams, 34 and 38, onto the etch processing chamber 44 where a plurality of substrates 26 are positioned. The etchants may be reused or recycled or disposed of using the overflow tank 42 and overflow spout 18. Heaters (not shown) can be provided, for example, by having heaters on the sides or at the bottom of the process chamber 44. The heaters may be external or inline.

Figure 2:
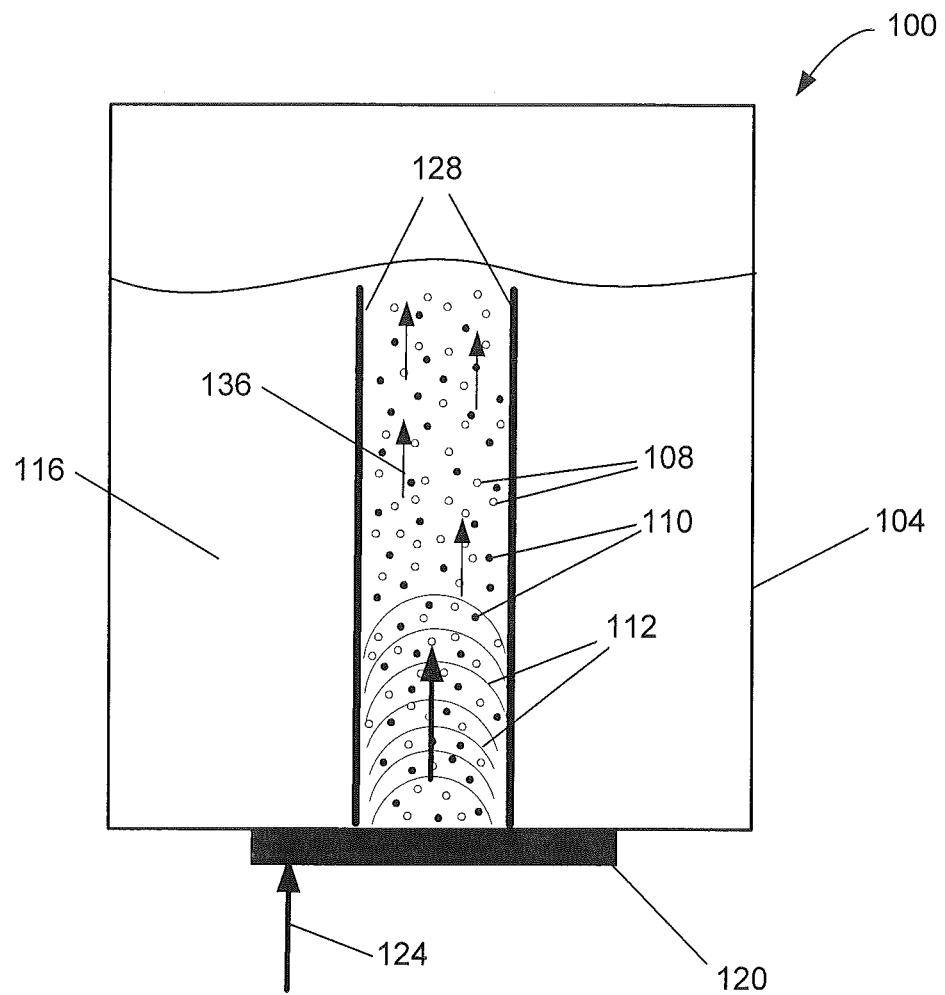
FIG. 2 depicts an exemplary architectural diagram for use of a sonic device in semiconductor manufacturing.

FIG. 2 depicts an exemplary architectural diagram 100 of a sonic device, for example, a sonic transducer, for use in semiconductor manufacturing. A sonic transducer 120 with a supplied power 124 is positioned proximate to a processing chamber 104 where the treatment liquid 116 is used to immerse one or more substrates 128. The acoustic waves 112 generated by the sonic device 120, which can comprise a piezoelectric crystal array, create bubbles 108 in an acoustic stream 136 in the treatment liquid 116. Bubbles 108 in the treatment liquid 116 undergo cavitation which generates high heat, raising the temperature of the treatment liquid 116. Particles 110, for example, residue from previous processes, are removed from the substrates 128 and placed in the acoustic stream 136 in the treatment liquid 116.

Figure 3A:
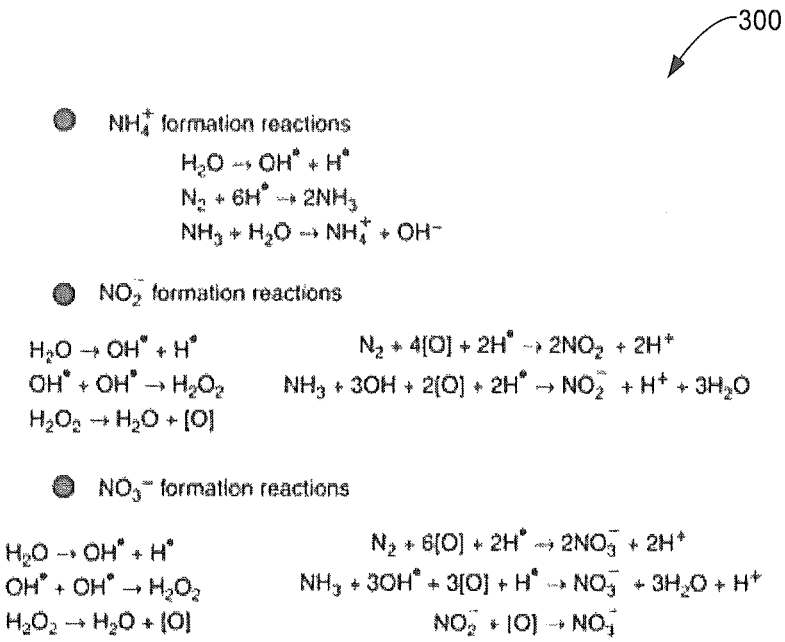
FIG. 3A depicts an exemplary substance generation process using ultra-pure water (UPW) and sonic irradiation.

FIG. 3A depicts reactions 300 using ultra-pure water (UPW) and sonic irradiation. As mentioned above, in aqueous and plasma chemistry, generation of radicals is a convenient way to generate highly reactive and targeted species to remove materials. Radicals are generated by mixing of two or more chemicals (e.g. sulfuric acid and hydrogen peroxide to form hydroxyl radicals) or by application of energy (heat, electrical/magnetic force, electrochemical, and mechanical force). In FIG. 3A, the first set of reactions generates the ammonium and the hydroxyl (OH) radical. The second set of reactions generates the nitrogen dioxide radical while the third set of reactions generates the nitrogen trioxide radical. These reactions are documented and well known in the art.

Figure 3B:
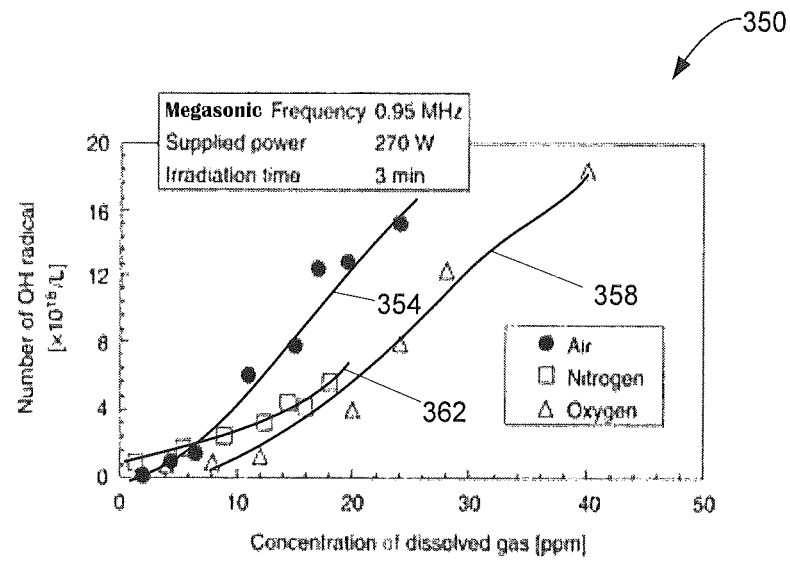
FIG. 3B depicts graphs of exemplary generation of OH radicals from air and deionized water with sonic irradiation as a function of the concentration of the dissolved gas.

FIG. 3B depicts graphs 350 of exemplary generation of OH radicals from air and deionized water with sonic irradiation as a function of the concentration of the dissolved gas. The graphs for air 354, nitrogen 362, and oxygen 358 are based on data where the megasonic frequency is 0.95 MHz, the supplied power is 270 W, and the irradiation time is 3 minutes. The Y-axis represents the number of OH radicals while the X-axis is the concentration of the dissolved gas or gasses in parts-per-million (ppm). For the aforesaid three gases, the number of OH radicals rises with rising concentration of the dissolved gas, with the steepest rise attributed to air as the dissolved gas.

Figure 4A:
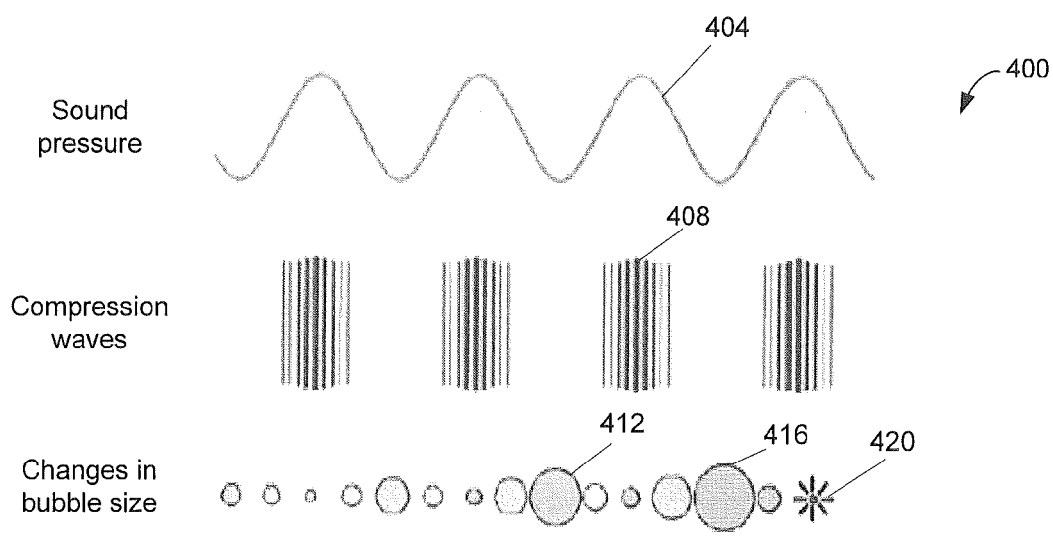
FIG. 4A depicts exemplary graphs of sound pressure, compression waves, and changes in bubble size involved in sono-chemistry.
Figure 4B:
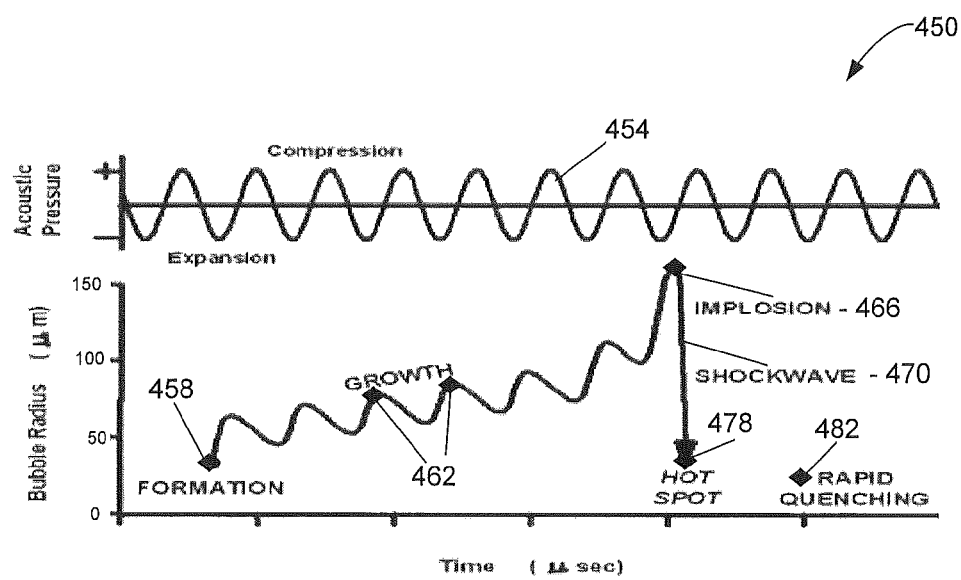
FIG. 4B depicts exemplary graphs of acoustic pressure, growth, and implosion of small bubbles in sono-chemistry.

FIG. 4A depicts exemplary graphs 400 of sound pressure, compression waves, and changes in bubble size involved in sono-chemistry, defined as the effect of sonic waves and wave properties on chemical systems. In particular, sonic irradiation is a specific method to locally produce significantly high temperatures when bubbles generated by the application of sonic energy collapse. As mentioned above, depending on bubble size prior to collapse temperatures from 3,000K to 3,000,000 K can be reached once a bubble collapses. Such temperatures are not possible for the bulk chemical stream but are powerful in initiating generation of aqueous radical species. In FIG. 4A, the combination of sound pressure 404 and compression waves 408 generated by the sonic device in the treatment liquid (not shown) results in an increase in the bubble size as depicted in larger bubble 412 and still larger bubble 416 until the burst bubble 420. As shown in FIG. 4B, the combination of acoustic and expansion/compression pressures 454 forms bubbles, at point 458, that alternately increase and decrease in size where the bubble radius increases as a function of irradiation time, point 462, until the bubbles implode, at point 466, creating a shockwave 470, and a hotspot at point 478, followed by rapid quenching at 482. The cavitation events, i.e., formation, increase/smaller decrease in bubble size, implosion, shock wave, and rapid quenching greatly enhance chemical reactivity of the primary and secondary chemical solutions and the one or more process gases.

Figure 5A:
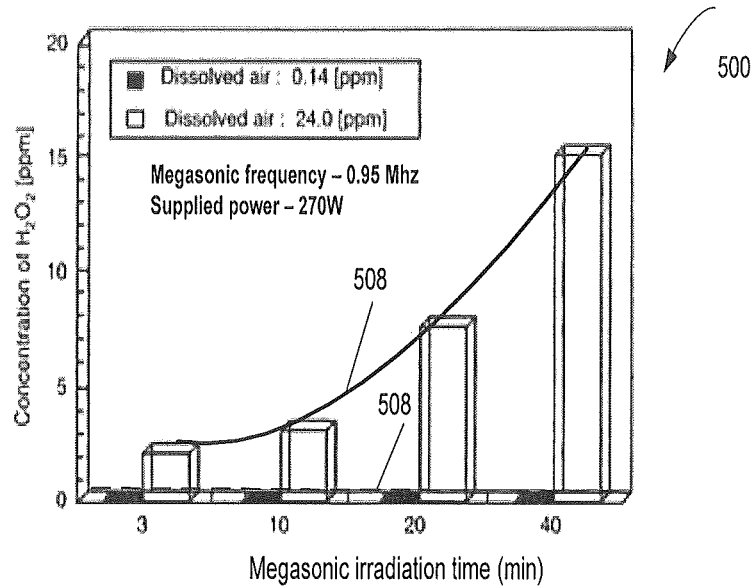
FIG. 5A depicts an exemplary graph of the effect of dissolved air on hydrogen peroxide generation from air and deionized water.

Control of generation of active chemical species in the primary and secondary chemical solutions is important to optimize cleaning processes with respect to removal efficiency and selectivity. FIG. 5A depicts an exemplary graph 500 of the effect of dissolved air on hydrogen peroxide generation from air and deionized water. The concentration of $H_2O_2$ increases from 2.5 ppm to about 15 ppm, along curve 508, as the megasonic irradiation time ranged from 3 to 40 minutes for a solution containing dissolved air at 24.0 ppm using a sonic device with supplied power set at 270 W and the megasonic energy frequency set at 0.95 MHz. In contrast, the concentration of $H_2O_2$ stays roughly constant during the megasonic irradiation time ranging from 3 to 40 minutes for a solution containing dissolved air at 0.14 ppm using a similar sonic device with supplied power at 270 W and the megasonic energy at 0.95 MHz.

Figure 5B:
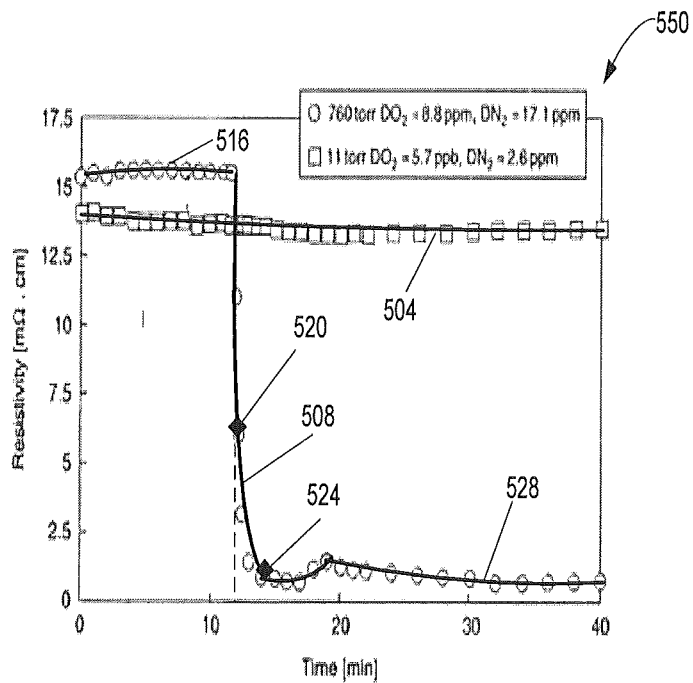
FIG. 5B depicts an exemplary graph of the variation of resistivity of ultra-pure water (UPW) with sonic irradiation.

FIG. 5B depicts an exemplary graph 550 of the variation of resistivity of ultra-pure water (UPW) with sonic irradiation as a function of time. The first graph 504 of resistivity as a function of elapsed time of megasonic irradiation is basically constant over a period of up to 40 minutes, where the pressure is at 760 torr, dioxygen (DO2) is 8.8 ppm, and dinitrogen (DN2) is 7.1 ppm. The second graph 508 of resistivity as a function of elapsed time of megasonic irradiation of up to 40 minutes, where the pressure is at 11 torr, DO2 is 5.7 ppm, and DN2 is 2.6 ppm, starts at about 16 mΩ/cm, line 516, and abruptly drops after several minutes of megasonic irradiation to 6 mΩ/cm, at point 520, dropping moderately from about 4.0 to about 1.0 mΩ/cm, at point 524, and leveling to about 1.0 mΩ/cm, line 528, until the end of the irradiation period.

Figures 6A, 6B:
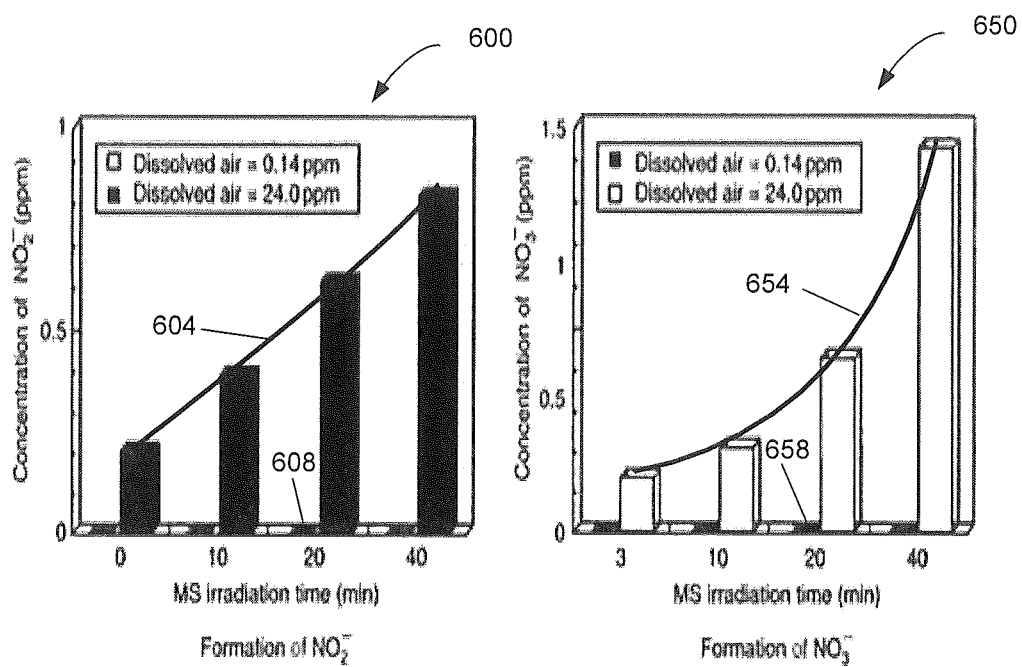
FIG. 6A depicts exemplary graphs showing the concentration of nitride ion species, $NO_2^-$, as a function of sonic irradiation time.
FIG. 6B depicts exemplary graphs showing the concentration of another nitride ion species, $NO_3^-$, as a function of sonic irradiation time.

FIG. 6A depicts exemplary graphs 604 showing the concentration of nitride ion species versus sonic irradiation time. The concentration of $NO_2^-$ is directly proportional in curve 604, increasing from 0.22 ppm to 0.82 ppm as a function of megasonic irradiation time from 0 to 40 minutes with the dissolved air at 24.0 ppm. In contrast, the $NO_2^-$ concentration is largely unchanged at close to zero ppm with the dissolved air concentration at 0.14 ppm in curve 608.

FIG. 6B depicts exemplary graphs 654 showing the concentration of another nitride ion species, $NO_3^-$ as a function of sonic irradiation time. The concentration of $NO_3^-$ depicts a parabolic correlation in curve 654, increasing from 0.22 ppm as a function of megasonic irradiation time from 3 to 40 minutes with the dissolved air is at 24.0 ppm. In contrast, the $NO_3^-$ concentration 624 is largely unchanged at close to zero ppm with the dissolved air concentration at 0.14 ppm.

In summary, the graphs in FIG. 3A to 6B depict interrelationships of surface treatment operating variables with the resulting amount and concentration of the active species generated from irradiation of the treatment liquid with one or more sonic devices. The surface treatment operating variables include supplied power and frequency of the irradiation energy of the one or more sonic devices, temperature, concentration, and flow rate of the primary and secondary chemical solutions, concentration and pressure of the one or more process gases, duration of the irradiation, and amount of sonic energy transmitted to the substrate. Integrated control of surface treatment operating variables is a critical factor in optimizing cleaning processes regarding removal efficiency of the desired material, removal time, and selectivity with respect to other materials present on the substrate.

Figure 7A:
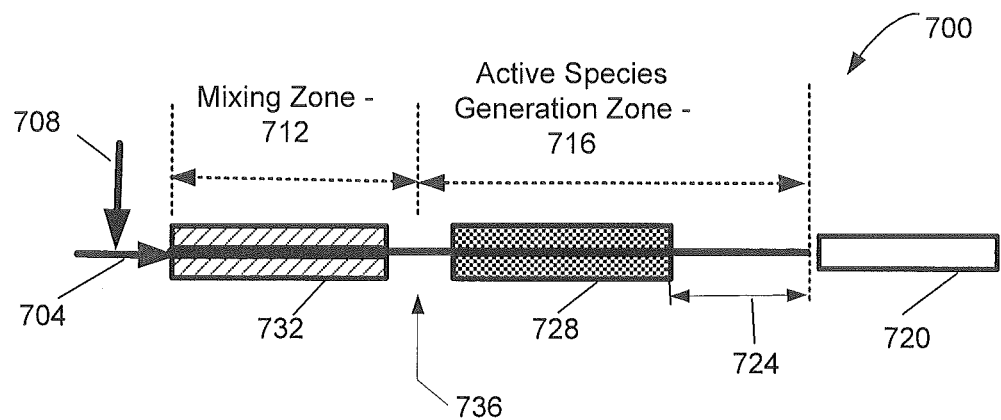
FIG. 7A is an exemplary schematic representation of a sonic irradiation mixing and chemical activation for a surface treatment system using single-pass chemicals.

FIG. 7A is an exemplary schematic representation 700 of sonic irradiation mixing and chemical activation for a surface treatment system using single-pass chemicals. A primary chemical solution 704 is flowed through a surface treatment system 700 where the surface treatment system 700 comprises a processing chamber (not shown) and a treatment liquid delivery system 736. A secondary chemical solution 708 is introduced into the treatment liquid delivery system 736, the treatment liquid delivery system 736 comprising a mixing zone 712 and active species generation zone 716. The primary chemical solution and the secondary chemical solution may include standard clean 1 (SC 1) or standard clean 2 (SC 2), phosphoric acid, hydrofluoric acid, buffered hydrogen fluoride, hydrofluoric acid and glycol, hydrofluoric acid and nitric acid, or ammonium hydroxide. In another embodiment, the primary chemical solution is ultra-pure water (UPW) saturated with nitrogen to generate a weak alkaline solution of ammonium hydroxide. In still another embodiment, the primary chemical solution is dilute sulfuric acid.

Still referring to FIG. 7A, the mixing zone 712 provides mixing of the primary chemical solutions and the secondary chemical solutions through the use of a first sonic device. The first sonic device 732 can have an operating range of 20 to 2,000 kHz and the supplied power to the first sonic device can have a range from 200 to 400. The active species generation zone 716 can include a second sonic device 728, having an operating range of 20 to 2,000 kHz and the supplied power to the second sonic device may range from 200 to 400. In an embodiment, two or more sonic devices are included in the surface treatment system. The treatment liquid delivery system 736 includes a portion that indicates a sonic device distance 724 to the substrate. The sonic device distance 724 can be varied to ensure no acoustic waves or energy are transmitted to the substrate. In another embodiment, the sonic device distance 724 is set such that a percentage of the sonic device energy is transmitted to the substrate. After mixing and active specie generation, the treatment liquid is dispensed into processing chamber (not shown) and onto a portion of a surface of the substrate 720. The surface treatment system 700 may be operated with single-pass primary chemical solutions and secondary chemical solutions without recirculating the resulting treatment fluid. In an embodiment, the primary chemical solution and/or secondary chemical solution may comprise a gas instead of a liquid chemical solution.

Figure 7B:
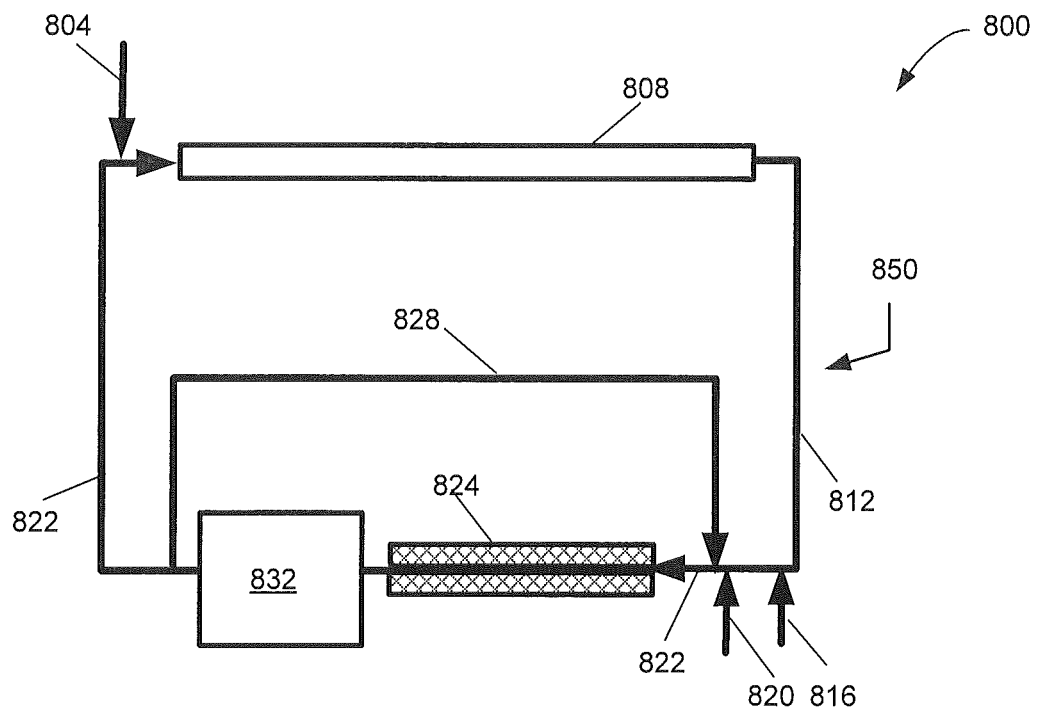
FIG. 7B is an exemplary schematic representation of a sonic surface treatment system using recirculation of chemicals.

FIG. 7B is an exemplary schematic representation 800 of a sonic surface treatment system using recirculation of the treatment fluid. A primary chemical solution 816 is flowed into the surface treatment system 800 where the surface treatment system 800 comprises a processing chamber (not shown) and a treatment liquid delivery system 850. A secondary chemical solution 820 is introduced into the treatment liquid delivery system 850. The combined primary chemical solution 816 and the secondary chemical solution 820, referred to now as treatment liquid 822 are processed through one or more sonic devices 824 and deliver the treatment liquid 822 into a tank 832. Some of the treatment liquid 822 from the tank 832 is injected into the treatment liquid delivery system 850 prior to the one or more sonic devices 824. A tertiary chemical solution 804 may be introduced into the treatment liquid delivery system 850 prior to dispense of the treatment liquid 822 onto a portion of a surface of the substrate 808. In an embodiment, the primary chemical solution and/or secondary chemical solution may comprise a gas instead of a liquid chemical solution.

The primary chemical solution and the secondary chemical solution may include standard clean 1 (SC 1) or standard clean 2 (SC 2), phosphoric acid, hydrofluoric acid, buffered hydrogen fluoride, hydrofluoric acid and glycol, hydrofluoric acid and nitric acid, or ammonium hydroxide. In another embodiment, the primary chemical solution is ultra-pure water (UPW) saturated with nitrogen to generate a weak alkaline solution of ammonium hydroxide. In still another embodiment, the primary chemical solution is dilute sulfuric acid. In yet another embodiment, the tertiary chemical solution can be one of the first chemical solution or second chemical solution or water needed to keep a mixing ratio target for the treatment liquid. A portion of the used treatment liquid 822 is recycled into the treatment liquid delivery system 850 using a recycle line 812.

Figure 8:
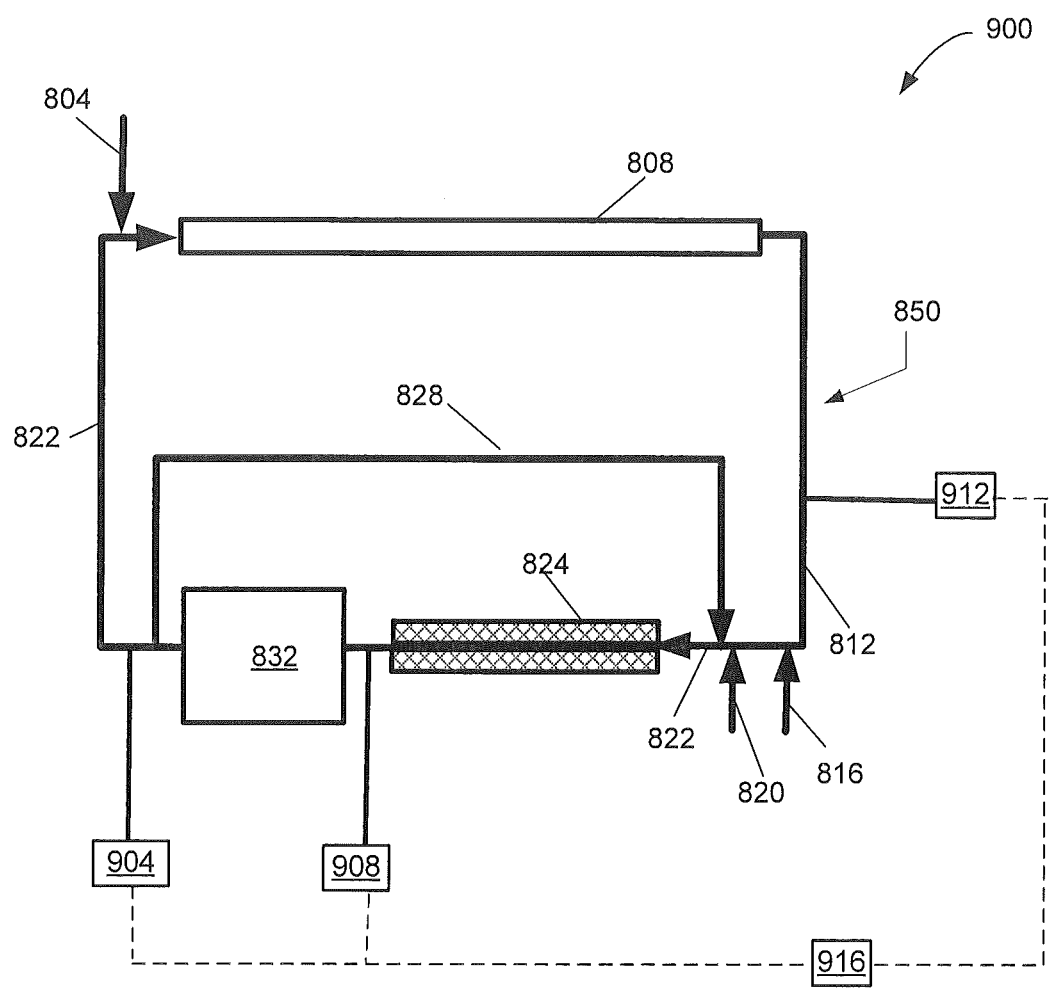
FIG. 8 is an exemplary schematic representation of a sonic surface treatment system using recirculation of chemicals and an integrated control system.

FIG. 8 is an exemplary schematic 900 depicting a surface treatment system using recirculation of chemical solutions and an integrated control system. The surface treatment system 900 in FIG. 8 is similar to the surface treatment system 800 in FIG. 7 with the addition of an integrated control system 916. A first control device 904, such as a controller or processor, can be used in controlling the operating variables of the first chemical solution and the second chemical solution such as temperature, concentration, and/or flow rate. A second control device 908, similarly, such as a controller or processor, can be used to control the operating variables of the one or more sonic devices 824 such as supplied power, frequency, and/or irradiation duration. A third control device 912 can be used to control other operating variables such sonic device distance, temperature of treatment liquid at dispense, and/or partial pressure of the one or more process gases. In one embodiment, the first, second, and third control devices are replaced with a single controller or processor.

Figure 9:
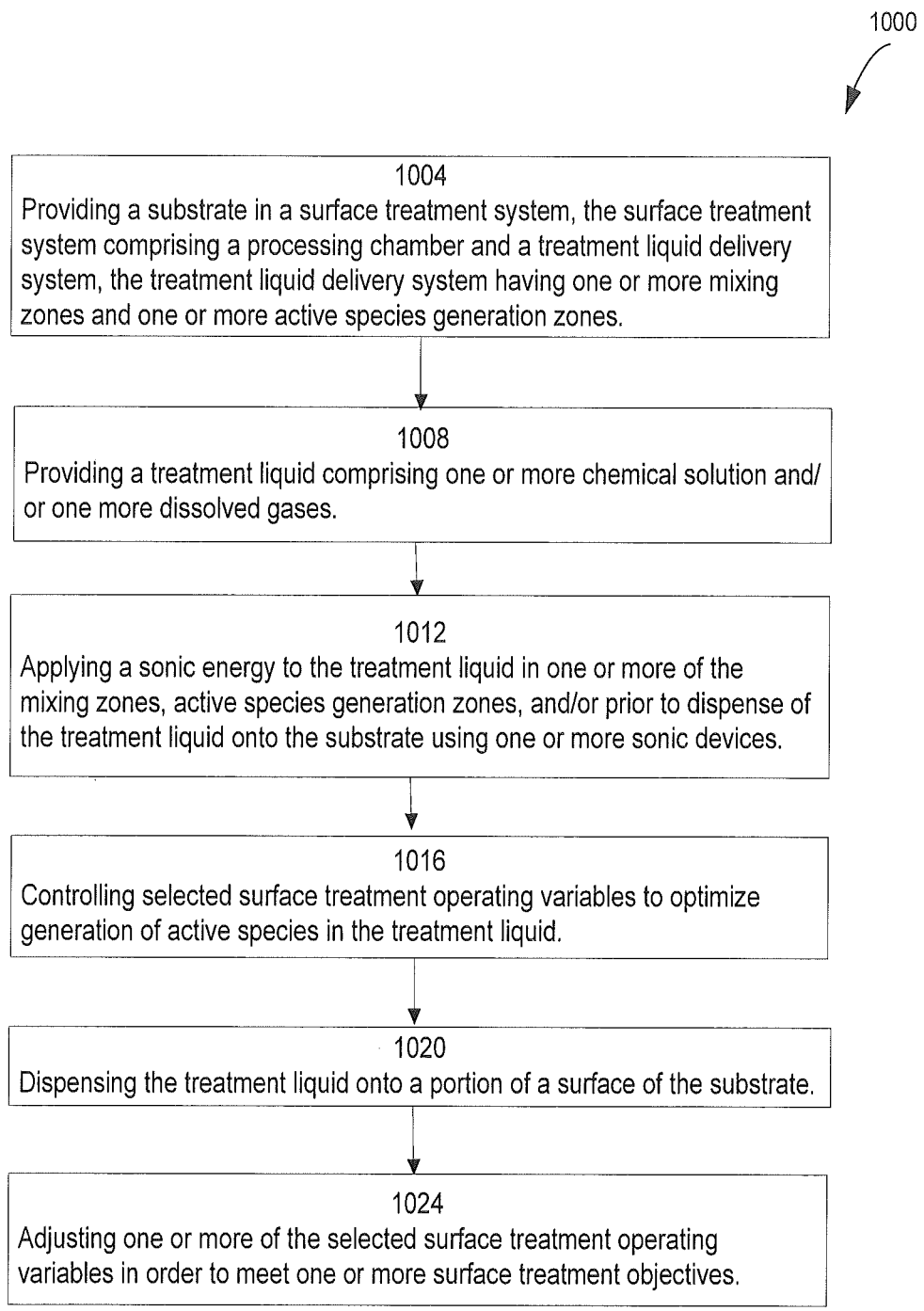
FIG. 9 is an exemplary flowchart for a method for a surface treatment process using sonic irradiation, recirculation of chemicals, and an integrated control system.
Figure 10:
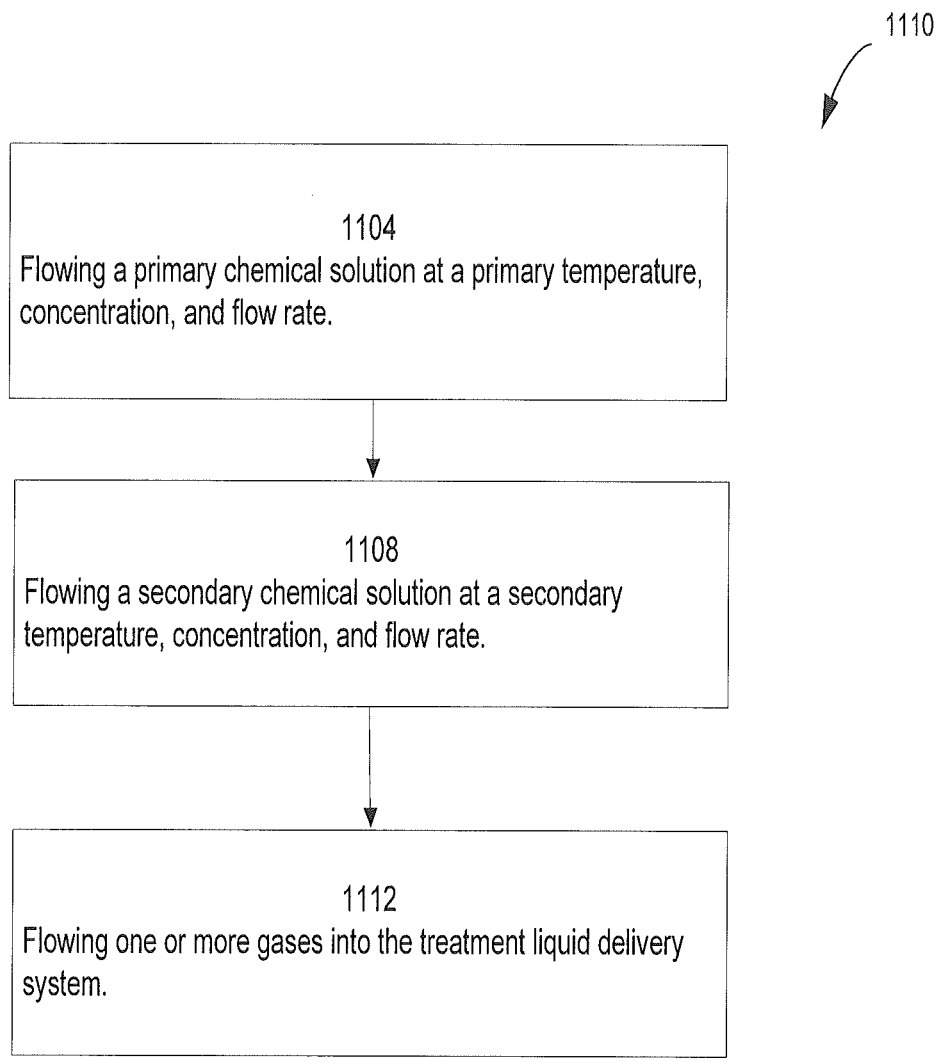
FIG. 10 is an exemplary flowchart for a method of providing one or more chemicals and one or more gases for use in a surface treatment system.

FIG. 9 is an exemplary flowchart for a method of a surface treatment system using sonic irradiation, recirculation of chemicals, and an integrated control system. In operation 1004, a substrate is provided to the surface treatment system, the surface treatment system comprising a processing chamber, an integrated control system, and a treatment liquid delivery system. The treatment liquid delivery system can include one or more mixing zones and one or more active specie generation zones. Details of the device processes are described in relation to FIG. 7A to 8. In operation 1008, a treatment liquid comprising one or more chemical solutions and/or one or more process gases is provided through the treatment liquid delivery system. Referring to FIG. 10, in operation 1104, a primary chemical solution at a primary temperature, concentration, and flow rate is introduced or flowed into the treatment liquid delivery system. In operation 1108, a secondary chemical solution at a secondary temperature, concentration, and flow rate is introduced or flowed into the treatment liquid delivery system. In operation 1112, one or more process gases at a gas temperature, partial pressure, and flow rate are introduced or flowed into the treatment liquid delivery system. As mentioned above, the details of the introduction, mixing, and active specie generation are described in relation to FIG. 7A to 8.

Figure 11:
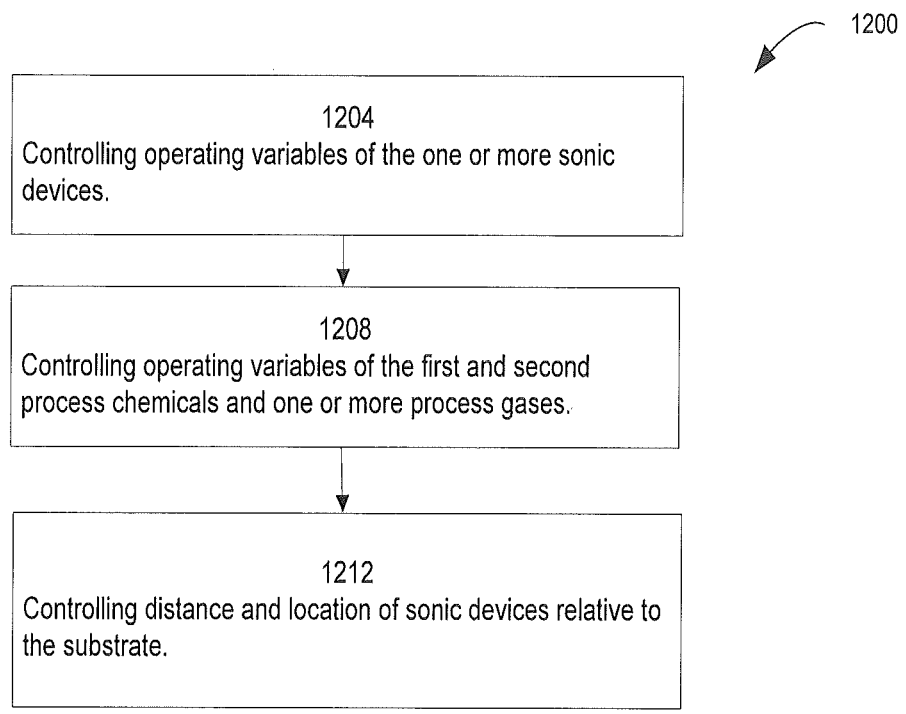
FIG. 11 is an exemplary flowchart for a method of controlling and optimizing the operating variables of a surface treatment system.

Referring to FIG. 9, in operation 1012, sonic energy is applied to the treatment liquid in one or more of the mixing zones, active species generation zones, and/or prior to dispense, using one or more sonic devices. The sonic devices can be sonic transducers in the ultra-sonic or megasonic frequency range, i. e. from 20 kHz to 2000 kHz. In operation 1016, selected surface treatment variables are controlled so as to optimize the generation of active species in the treatment liquid. Referring to FIG. 11, in operation 1204, operating variables for the one or more sonic devices are controlled to optimize the generation of the active species of the treatment liquid. The operating variables for the one or more sonic devices can include supplied power, frequency range, bubble radius, bubble cavitation events, irradiation time, sonic energy distribution, and the like. In operation 1208, the operating variables of the primary chemical solution, the secondary chemical solution, and/or the process gases are controlled so as to optimize the generation of active species in the treatment liquid. In operation 1212, the distance and location of the sonic devices relative to the substrate is controlled so as to optimize the generation of active species in the treatment liquid. As mentioned above, the sonic device distance may be increased to ensure the sonic energy is not transmitted to the substrate. In another embodiment, the sonic device distance is decreased to impart some or more of the sonic energy to the substrate. The arrangement and location of the one or more sonic devices may be adjusted to optimize the generation of active species in the treatment liquid. Furthermore, the one or more sonic devices can be used to adjust the temperature of the treatment liquid prior to dispense in the processing chamber.

Still referring to FIG. 9, in operation 1020, the treatment liquid is dispensed onto a portion of a surface of the substrate. In one embodiment, the substrate is positioned in a single substrate processing chamber and the treatment liquid can be dispensed onto the substrate surface using one or more nozzles. In another embodiment, the treatment liquid is introduced into a wet batch process chamber where a plurality of substrates is being processed. The single substrate and wet batch process may use single pass primary and secondary chemical solutions or recycle the treatment liquid. In operation 1024, one or more of the selected surface treatment operating variables is adjusted to meet one or more surface treatment objectives. The one or more surface treatment objectives can include surface preparation, cleaning, or etch completion time, percentage of residue or layer removal, cost of ownership, and the like.

Figure 12:
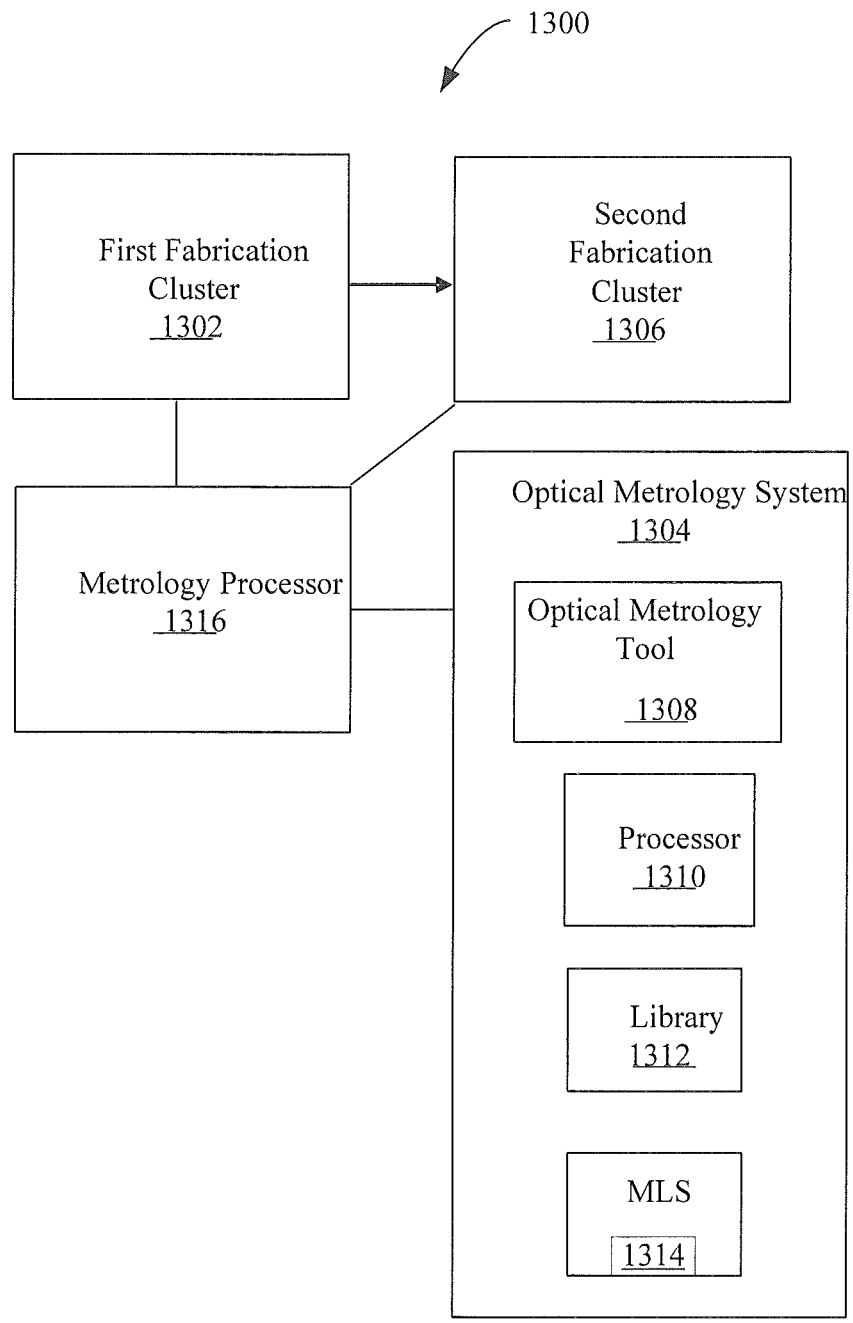
FIG. 12 is an exemplary block diagram of a system for determining and utilizing profile parameters of a structure including critical dimensions on a substrate during or after surface preparation, cleaning or etch processing where the profile parameter values are used for automated process and equipment control.

FIG. 12 is an exemplary block diagram of a system for determining and utilizing profile parameters of a structure including critical dimensions on a substrate during or after surface preparation, etch processing, or cleaning where the profile parameter values are used for automated process and equipment control. System 1300 includes a first fabrication cluster 1302 and optical metrology system 1304. System 1300 also includes a second fabrication cluster 1306. For details of an optical metrology system used to determine profile parameters of a structure on a substrate, refer to U.S. Pat. No. 6,943,900, titled GENERATION OF A LIBRARY OF PERIODIC GRATING DIFFRACTION SIGNALS, issued on Sep. 13, 2005, which is incorporated herein by reference in its entirety. Although the second fabrication cluster 1306 is depicted in FIG. 12 as being subsequent to the first fabrication cluster 1302, it should be recognized that the second fabrication cluster 1306 can be located prior to first fabrication cluster 1302 in system 1300, for example, in the manufacturing process flow.

A surface preparation, etching or cleaning process, can be performed using first fabrication cluster 1302. In one exemplary embodiment, optical metrology system 1304 includes an optical metrology tool 1308 and processor 1310. Optical metrology tool 1308 is configured to measure a diffraction signal off the structure. Processor 1310 is configured to use the measured diffraction signal measured by the optical metrology tool and adjust using a signal adjuster, generating an adjusted metrology output signal. Furthermore, processor 1310 is configured to compare the adjusted metrology output signal to the simulated diffraction signal. As mentioned above, the simulated diffraction is determined using an optical metrology tool model using ray tracing, a set of profile parameters of the structure and numerical analysis based on the Maxwell equations of electromagnetic diffraction. In one exemplary embodiment, optical metrology system 1304 can also include a library 1312 with a plurality of simulated diffraction signals and a plurality of values of one or more profile parameters associated with the plurality of simulated diffraction signals. As described above, the library can be generated in advance; metrology processor 1310 can compare an adjusted metrology output signal to the plurality of simulated diffraction signals in the library. When a matching simulated diffraction signal is found, the one or more values of the profile parameters associated with the matching simulated diffraction signal in the library is assumed to be the one or more values of the profile parameters used in the substrate application to fabricate the structure.

System 1300 also includes a metrology processor 1316. In one exemplary embodiment, processor 1310 can transmit the one or more values of the one or more profile parameters to metrology processor 1316. Metrology processor 1316 can then adjust one or more process parameters or equipment settings of the first fabrication cluster 1302 based on the one or more values of the one or more profile parameters determined using optical metrology system 1304. Metrology processor 1316 can also adjust one or more process parameters or equipment settings of the second fabrication cluster 1306 based on the one or more values of the one or more profile parameters determined using optical metrology system 1304. As noted above, second fabrication cluster 1306 can process the substrate before or after fabrication cluster 1302. In another exemplary embodiment, processor 1310 is configured to train machine learning system 1314 using the set of measured diffraction signals as inputs to machine learning system 1314 and profile parameters as the expected outputs of machine learning system 1314.

In another embodiment, the metrology processor 1316 receives one or more sensor measurement signals from the first fabrication cluster 1302. The sensor measurement signals can be from a surface preparation system, an etch processing system or a cleaning system and can include concentrations of one or more process chemicals or chemical solutions or process gases or reaction products, flow rates of the process chemicals or reaction products, a temperature of the treatment liquid at dispense in the processing chamber or the like. The sensor measurement signals by itself or in conjunction with the optical metrology signals can be used by the metrology processor 1316 to determine one or more profile parameters of the structure being etched or cleaned. Metrology processor 1316 can then adjust one or more process parameters or equipment settings of the first fabrication cluster 1302 or the second fabrication cluster 1306 based on the one or more values of the one or more profile parameters determined using the sensor measurement signals and/or in conjunction with the one or more profile parameters determined using optical metrology system 1304.

Although exemplary embodiments have been described, various modifications can be made without departing from the spirit and/or scope of the present invention. For example, the invention was illustrated and described etch processing, surface preparation or cleaning of a substrate. Other layers or structures on a substrate can be processed using the same methods and systems described in the specification. Therefore, the present invention should not be construed as being limited to the specific forms shown in the drawings and described above. Accordingly, all such modifications are intended to be included within the scope of this invention.

What is claimed:

1. A method of generating active species in a treatment liquid used in a surface treatment system, the surface treatment system comprising a processing chamber and a treatment liquid delivery system, the treatment liquid delivery system having a mixing zone and an active species generation zone, the method comprising:
    providing a substrate requiring surface treatment in the processing chamber of the surface treatment system;
    providing a treatment liquid into the treatment liquid delivery system, wherein the providing comprises:
    introducing a primary chemical solution at a primary temperature, concentration, and flow rate,
    introducing a secondary chemical solution at a secondary temperature, concentration, and flow rate, and
    introducing one or more process gases, each gas of the one or more process gases having a concentration;
    applying sonic energy at a frequency range from 20 to 2,000 kHz to the treatment liquid in the mixing zone and/or the active species generation zone using one or more sonic devices positioned outside the processing chamber;
    controlling one or more selected surface treatment operating variables to optimize generation of active species in the treatment liquid, wherein the controlling comprises:
    controlling the one or more selected operating variables associated with the one or more sonic devices,
    controlling the one or more selected operating variables associated with the primary and secondary chemical solutions and/or with the one or more process gases; and
    controlling a distance between the one or more sonic devices outside the processing chamber and the substrate inside the processing chamber in order to vary the amount of sonic energy transmitted to the substrate, wherein controlling the distance between the one or more sonic devices outside the processing chamber and the substrate inside the processing chamber includes adjusting the distance to a sufficient distance such that no sonic energy is transferred directly into the processing chamber to the substrate;
    dispensing the treatment liquid containing the active species into the processing chamber; and
    adjusting the one or more selected surface treatment operating variables in order to meet one or more surface treatment objectives.

2. The method of claim 1 wherein the primary chemical solution is ultra-pure water (UPW) saturated with nitrogen to generate a weak alkaline solution of ammonium hydroxide or the primary chemical solution is dilute sulfuric acid and the applying of sonic energy is configured to generate peroxide species in-situ from water molecules and in turn create Caro's acid.

3. The method of claim 1 wherein the primary and secondary chemical solutions include one or more of standard clean 1 (SC 1), standard clean 2 (SC 2), phosphoric acid, hydrofluoric acid, buffered hydrogen fluoride, hydrofluoric acid and glycol, hydrofluoric acid and nitric acid, or ammonium hydroxide.

4. The method of claim 1 wherein the treatment liquid is dispensed onto a portion of a surface of the substrate in a single substrate process.

5. The method of claim 1 wherein the surface processing system comprises a cleaning system, a surface preparation system, or an etch system.

6. The method of claim 1 wherein the one or more selected surface treatment operating variables include the supplied power to the one or more sonic devices.

7. The method of claim 1 wherein the one or more selected surface treatment operating variables include the frequency range of the one or more sonic devices.

8. The method of claim 1 wherein the one or more selected surface treatment operating variables include the temperature, concentration, and flow rate of the primary chemical solution, the temperature, concentration, and flow rate of the secondary chemical solution, and the concentration of the one or more process gases.

9. The method of claim 1 further comprising:
    recycling a portion of the treatment liquid in a recycle line coupled to the treatment liquid delivery system.

10. The method of claim 9 wherein the secondary chemical solution is introduced into the treatment liquid delivery system prior to the recycle line.

11. The method of claim 9 wherein a chemical solution tank is used to mix the treatment liquid after the active species generation zone and prior to dispensing the treatment liquid into the processing chamber.

12. The method of claim 11 wherein a sonic transducer is positioned in the active species generation zone after introduction of the primary chemical solution and/or the secondary chemical solution into the treatment liquid delivery system and prior to the chemical solution tank.

13. The method of claim 9 wherein the primary chemical solution is ultra-pure water (UPW) saturated with nitrogen to generate a weak alkaline solution of ammonium hydroxide.

14. The method of claim 9 wherein the primary chemical solution is dilute sulfuric acid and the application of sonic energy is configured to generate peroxide species in-situ from water molecules into Caro's acid, or Caro's acid and subsequent reactant products.

15. The method of claim 9 wherein the treatment liquid is dispensed onto a portion of a surface of the substrate in a single substrate processing.

16. The method of claim 9 wherein the primary chemical solution is deionized water and air and the applying sonic energy is configured to generate in situ hydrogen peroxide.

17. The method of claim 9 wherein the surface processing system includes a cleaning system, a surface preparation system or an etch system.

18. The method of claim 9 wherein the primary and secondary chemical solutions include standard clean 1 (SC 1) or standard clean 2 (SC 2).

19. The method of claim 9 wherein the surface treatment system is used for nitride etching and the primary and secondary chemical solutions include one or more of phosphoric acid, hydrofluoric acid, buffered hydrogen fluoride or hydrofluoric acid and glycol.

20. The method of claim 9 wherein the surface treatment system is used for silicon etching and the primary and secondary chemical solutions include hydrofluoric acid and nitric acid, or ammonium hydroxide.

21. The method of claim 1 wherein the applying sonic energy results in creating bubble collapse events to initiate radical species generation or to increase the reaction rate between the radical species and the substrate.

22. A method of generating active species in a chemical solution used in a surface treatment system, the surface treatment system processing a substrate and comprising a processing chamber and a treatment liquid delivery system, the treatment liquid delivery system having a mixing zone and an active species generation zone, the method comprising:
   selecting one or more surface treatment operating variables of the surface treatment system in order to meet one or more surface treatment objectives; providing a substrate in the surface treatment system;
   providing a treatment liquid comprising one or more chemical solutions and/or one or more process gases;
   applying sonic energy to the treatment liquid in a mixing zone and/or an active species generation zone using one or more sonic devices positioned outside the processing chamber;
   controlling the one or more selected surface treatment operating variables to optimize generation of active species in the treatment liquid, wherein the controlling comprises controlling a distance between the one or more sonic devices outside the processing chamber and the substrate inside the processing chamber in order to control the amount of sonic energy transmitted to the substrate, wherein controlling the distance between the one or more sonic devices outside the processing chamber and the substrate inside the processing chamber includes adjusting the distance to a sufficient distance such that no sonic energy is transferred directly into the processing chamber to the substrate;
   dispensing the treatment liquid into the processing chamber; and
   adjusting the one or more selected surface treatment operating variables in order to meet one or more surface treatment objectives;
   wherein the sonic energy utilizes a frequency range from 20 to 2,000 kHz.

23. The method of claim 22 wherein dispensing of the treatment liquid is performed in a single substrate process.

24. The method of claim 22 wherein dispensing of the treatment liquid is performed in a batch substrate process.

25. The method of claim 22 wherein the one or more selected surface treatment operating variables includes one or more of supplied power and frequency of the one or more sonic devices.

26. The method of claim 22 wherein the one or more selected surface treatment operating variables includes one or more of the temperature, concentration, and flow rate of a primary chemical solution of the one or more chemical solutions, the temperature, concentration, and flow rate of a secondary chemical solution of the one or more chemical solutions, and/or the concentration of the one or more process gases.

* * * * *